(12) United States Patent
Terao et al.

(10) Patent No.: US 7,335,907 B2
(45) Date of Patent: Feb. 26, 2008

(54) MEMORY DEVICE

(75) Inventors: Motoyasu Terao, Hinode (JP); Norikatsu Takaura, Tokyo (JP); Kenzo Kurotsuchi, Kokubunji (JP); Hideyuki Matsuoka, Nishitokyo (JP); Tsuyoshi Yamauchi, Isahaya (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/790,881

(22) Filed: Mar. 3, 2004

(65) Prior Publication Data
US 2004/0233748 A1 Nov. 25, 2004

(30) Foreign Application Priority Data
Mar. 25, 2003 (JP) .............................. 2003-081724

(51) Int. Cl.
*H01L 47/00* (2006.01)
(52) U.S. Cl. .................... 257/2; 257/42; 257/529; 365/46; 365/148
(58) Field of Classification Search .................. 257/2
See application file for complete search history.

(56) References Cited

U.S. PATENT DOCUMENTS

| | | | |
|---|---|---|---|
| 3,271,591 A | | 9/1966 | Ovshinsky |
| 5,271,978 A | * | 12/1993 | Vazan et al. ............... 428/64.4 |
| 5,335,219 A | | 8/1994 | Ovshinsky et al. |
| 5,406,509 A | | 4/1995 | Ovshinsky et al. |
| 5,825,046 A | | 10/1998 | Czubatyj et al. |
| 5,883,827 A | | 3/1999 | Morgan |
| 2003/0003634 A1 | | 1/2003 | Lowrey et al. |
| 2003/0214857 A1 | * | 11/2003 | Horie et al. ................ 365/200 |
| 2004/0114413 A1 | * | 6/2004 | Parkinson et al. .......... 365/100 |

FOREIGN PATENT DOCUMENTS

| | | |
|---|---|---|
| EP | 0335469 | 10/1989 |
| JP | B-43-8393 | 3/1968 |
| JP | A-47-4832 | 3/1972 |
| JP | 2003-229537 | 8/2003 |

OTHER PUBLICATIONS

Stefan Lai, et al., OUM—A 180 nm Nonvolatile Memory Cell Element Technology for Stand Alone and Embedded Applications; IEEE International Electron Devices Meeting, Technical Digest, pp. 803-806; 2001.

(Continued)

*Primary Examiner*—Jerome Jackson
(74) *Attorney, Agent, or Firm*—Antonelli, Terry, Stout & Kraus, LLP.

(57) ABSTRACT

A phase change memory device is provided which is constituted by memory cells using memory elements and select transistors and having high heat resistance to be capable of an operation at 140 degrees or higher. As a device configuration, a recording layer of which, of Zn—Ge—Te, content of Zn, Cd or the like is 20 atom percent or more, content of at least one element selected from the group consisting of Ge and Sb is less than 40 atom percent, and content of Te is 40 atom percent or more is used. It is thereby possible to implement the memory device usable for an application which may be performed at a high temperature such as an in-vehicle use.

8 Claims, 12 Drawing Sheets

OTHER PUBLICATIONS

Bernacki S. et al, "Total Dose Radiation Response and High Temperature Imprint Characteristics of Chalcogenide Based RAM Resistor Elements," IEEE Transactions on Nuclear Science, vol. 47, No. 6, Dec. 6, 2000 (pp. 2528-2533), XP002358166.

Maimon Jr., et al, "Chalcogenide-based Non-Volatile Memory Technology<1>," Aerospace Conf., IEEE Proceedings. Mar. 10-17, 2001, Piscataway, NJ, USA, IEEE, vol. 5, Mar. 10, 2001, pp. 2289-2294, XP010548238 ISBN: 0-7803-6599-2.

Chong T.C., et al, "Superlattice-like Structure for Phase Change Optical Recording," Journal of Applied Physics, American Institute of Physics, N.Y., vol. 91, No. 7, Apr. 1, 2002, pp. 3981-3987, XP012056054 ISSN: 0021-8979.

* cited by examiner

MEMORY DEVICE

The present application claims priority from Japanese application JP2003-081724, filed on Mar. 25, 2003, the content of which is hereby incorporated by reference into this application.

BACKGROUND OF THE INVENTION

The present invention relates to a semiconductor nonvolatile memory and, in particular, to a recording device using a phase change material.

An example of a nonvolatile memory using a phase change film is described in detail in U.S. Pat. No. 5,883,827. This nonvolatile memory is a phase change memory in which a crystalline state of a memory element changes according to Joule heat (i.e., heat energy) caused by a current passing in the memory element itself and memory information is thereby written. As the temperature is caused to exceed 600° C. by the Joule heat and thereby melting a recording layer once when becoming amorphous, a resistance value of the memory element is changed by two to three digits according to the crystalline state, although its write current is high. This memory uses the resistance value as a signal, and so a read signal is large and sense operation is easy.

FIG. 2 shows a schematic diagram of a configuration of the phase change memory in FIG. 12 of U.S. Pat. No. 5,883,827. The phase change memory is comprised of a memory array, a row decoder XDEC, a column decoder YDEC, a read circuit RC and a write circuit WC. The memory array has a memory cell MCpr (p'=0, 1, . . . n, r=0, 1, . . . m) placed at each intersection of a word line WLp (p=1, . . . , n) and a data line DLr (r=1, . . . , m). Each memory cell has a memory element RM and a select transistor QM connected in series inserted between a data line DL and a ground potential. A word line WL is connected to a gate of the select transistor, and a column select line YSr (r=1, . . . , m) is connected to a corresponding column select switch Qar, respectively.

According to such a configuration, the select transistor on the word line selected by the row decoder XDEC conducts, and the column select switch corresponding to the column select line selected by the column decoder YDEC also conducts. A current path is thereby formed in a selected memory cell so that a read signal is generated on a common data line I/O. The resistance value in the selected memory cell is different depending on the memory information, and so the voltage outputted to the common data line I/O is different depending on the memory information. This difference is determined by the read circuit RC which reads the memory information of the selected memory cell.

JP-A-2001-502848 (corresponding to U.S. Pat. No. 5,825, 046) describes a memory material including a transition metal element as the memory material used for an electrical memory element. According to a definition in the past, the transition metal element does not include a metal from the 2b group (of the Periodic Table of Elements) in many cases. However, the specification defines those up to the 2b group as the transition metal elements. An embodiment thereof describes a Ge—Sb—Te material as including Ti of less than 10 atom percent and so on.

SUMMARY OF THE INVENTION

However, a phase change memory expected as a next generation semiconductor nonvolatile memory uses a recording film material of an optical disk as a phase change layer. Nevertheless, the recording film material of the optical disk represented by $Ge_2Sb_2Te_5$ is not sufficiently heat-resistant for a semiconductor memory required to be usable at a temperature higher than that for the optical disk.

Therefore, an object of the present invention is to provide a nonvolatile memory having an optimum resistance value when rendered as a small-area element and capable of high-temperature operation.

The object is attained by using the recording film material for, as a phase change film of the nonvolatile memory, recording information by causing a reversible phase change between a crystal phase and an amorphous phase, the material including (1) a finite amount of at least one element selected from the group consisting of Ge and Sb, (2) Te of 40 atom percent or more, and (3) at least one element selected from the elements in a 2b group, 1b group, 3a to 7a groups and an 8 group of 20 atom percent to 50 atom percent.

Here, it is for the sake of keeping a high crystallization temperature that the composition of the phase change film includes Te of 40 atom percent or more and, also, includes at least one element selected from the elements in a 2b group, 1b group, 3a to 7a groups and an 8 group of 20 atom percent to 50 atom percent. Such will be described by taking Zn as a representative element of the 2b group, 1b group, 3a to 7a groups and 8 group, and Ge as a representative of at least one element selected from the group consisting of Ge and Sb as examples. In the case of a composition including a lot of Zn, it is conceivable that Ge—Te is incorporated in an amorphous network of Zn—Te having strong bonding power where a stable crystal system is mutually different, resulting in keeping the high crystallization temperature as a whole. Here, it is assumed that, due to addition of Ge, it becomes more covalently bound due to strongly ionic ZnTe so that the amorphous network (network structure) can hardly be deformed while it becomes crystallized at a high speed like dominoes once the crystallization starts.

FIG. 13 shows a relationship between an amount of Zn added to $Ge_{25}Te_{75}$ and a melting point. The melting point of a solid-phase portion is at 900° C. or higher if Zn is 20 atom percent to 50 atom percent (i.e., if the atomic percent of Zn is 20 to 50). The melting point of the solid-phase portion is high even in the case of over 50 atom percent (i.e., an atomic percent of above 50). However, in the case of over 50 atom percent, oxidation resistance is drastically reduced and a recording layer is damaged or exfoliated in a memory element production process so that it is difficult to pass it to a final process.

FIG. 14 shows a relationship between the amount of Zn added to $Ge_{25}Te_{75}$ and a maximum operating temperature of a memory element described in the embodiment. An element operation at 140° C. or higher is possible if Zn is in a range of 20 atom percent to 50 atom percent. In the case of an automotive engine control purpose, requested specification of automotive manufacturers calls for a maximum operation temperature of 140° C., which is higher than the maximum operating temperature of 120° C. of an ordinary memory element, and it can be satisfied by the configuration herein. However, the requested specification cannot be satisfied by a material composition including Ti of less than 10 atom percent, as described in JP-A-2001-502848.

Cd, which is in the same 2b group as Zn, shows a little less but nearly equivalent heat resistance. As for the melting point and crystallization temperature, the elements in the 1b group, 3a to 7a groups and an 8 group are lower than those including the 2b-group elements, but remain durable at 130°

C. so as to withstand continuous running for less than ten hours if accommodated in a heat insulating case.

Therefore, in the case of the memory device using the material of the present invention, crystallization temperature is high, and the high-temperature operation and high-temperature memory holding can be expected.

Other objects, features and advantages of the invention will become apparent from the following description of the embodiments of the invention taken in conjunction with the accompanying drawings.

DETAILED DESCRIPTION OF THE EMBODIMENTS

First Embodiment

Hereafter, embodiments of the present invention will be described in detail by using the accompanying drawings. Though there is no particular restriction as to circuit elements constituting blocks of the embodiments, they are typically formed on one semiconductor substrate such as a single crystal silicon by employing a semiconductor integrated circuit technology such as CMOS (Complementary MOS Transistor) in the public domain. Furthermore, they are created by using a chalcogenide material for showing a phase change as a hybrid to an integrated circuit creation technology.

(Memory Array Configuration)

Figure 1:
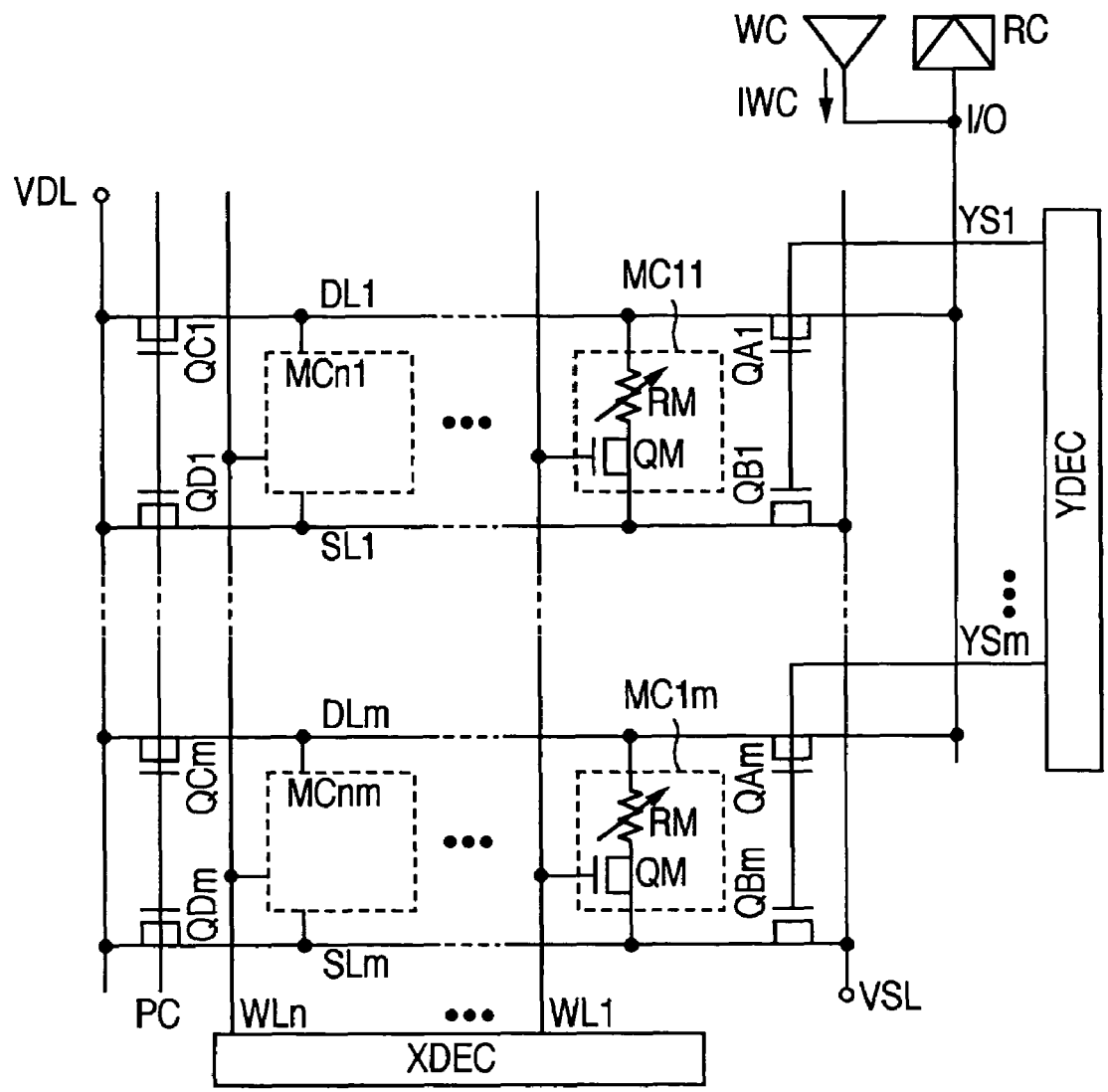
FIG. 1 is a diagram showing a configuration example of a memory array using a memory cell comprised of one memory element and one select transistor for changing resistance according to memory information according to the present invention.

FIG. 1 shows a configuration example of a memory array according to the present invention. FIG. 1 also shows a row decoder XDEC, a column decoder YDEC, a read circuit RC and a write circuit WC necessary for an operation of the memory array. This configuration is characterized in that a source line parallel to a data line is provided, and a precharge circuit for equipotentially driving both the data lines and the source lines and a circuit for selectively driving a select source line are placed so as to generate a current path only on a select cell at an intersection of a selected word line and a selected source line.

Figure 2:
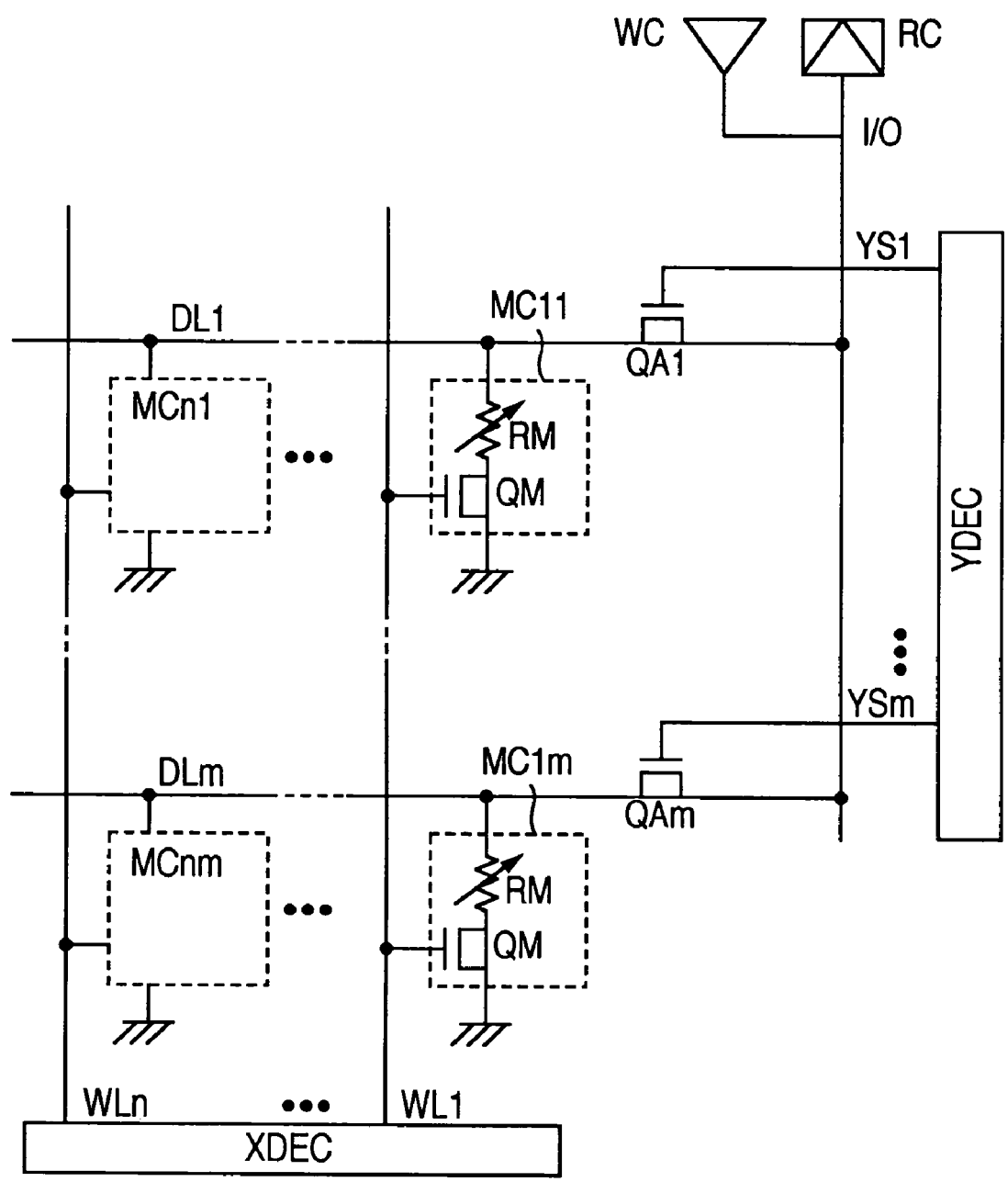
FIG. 2 is a diagram showing a prior art configuration example of the memory array using the memory cell comprised of one memory element and one select transistor for changing the resistance according to the memory information.

As with the aforementioned FIG. 2, the configuration of the memory array having a memory cell of n×m bits is shown. An element constituting the memory cell is a memory element RM using variable resistance of a select transistor QM and the chalcogenide material.

The row decoder XDEC selects a word line WL according to a row address. The column decoder YDEC drives a column select line YS according to a column address. As a column select switch QA according to a selected column select line YS conducts, a selected memory cell is connected to the read circuit RC and the write circuit WC via a common data line I/O. Here, QA1 to QAm may be regarded as forming a first switch circuit for selecting one of a plurality of data lines (DL1 to DLm) and connecting it to a common data line. QB1 to QBm may be regarded as forming a second switch circuit for selecting one of a plurality of source lines (SL1 to SLm) and connecting it to a source voltage supply line.

The memory array configuration has the following three characteristics. First, a plurality (m pieces here) of source lines SLr (r=1, . . . , m) in parallel with the data lines DL are placed, and sources of the transistors QM in a column direction are connected in common to the source lines SL. Secondly, a plurality (m pieces here) of NMOS transistors Qar are inserted between each data line DLr (r=1, . . . , M) and the common data line I/O and a plurality of NMOS transistors QBr (r=1, . . . , m) are inserted between each source line SLr and a voltage terminal VSL, and the transistors QAr and QBr are selected by the column decoder. FIG. 1 shows an example in which a column select line YSr corresponding to these gates is directly connected. Thirdly, a plurality (m pieces here) of NMOS transistors QCr and QDr (r=1, . . . , m) for driving corresponding data lines DL and source lines SL to a precharge voltage VDL are placed, and a precharge enable signal PC is connected to the gates of these transistors. It is possible, according to this configuration, to drive the source line corresponding to the data line to be selected from a plurality of data lines DL and source lines SL driven by a precharge voltage VPC. To be more specific, it is possible to apply a voltage difference only to the memory cell connected to the data line and source line to be selected. Therefore, it is feasible to form the current path only on a desired memory cell on a select word line so as to generate a read signal only to a select data line.

The precharge circuit may be interpreted as the entirety of QC1, QD1 to QCm, and QDm, and QC1 and QD1 may be regarded as element precharge circuits provided to each pair of DL1 and SL1.

(Characteristics of the Memory Element)

Figure 3:
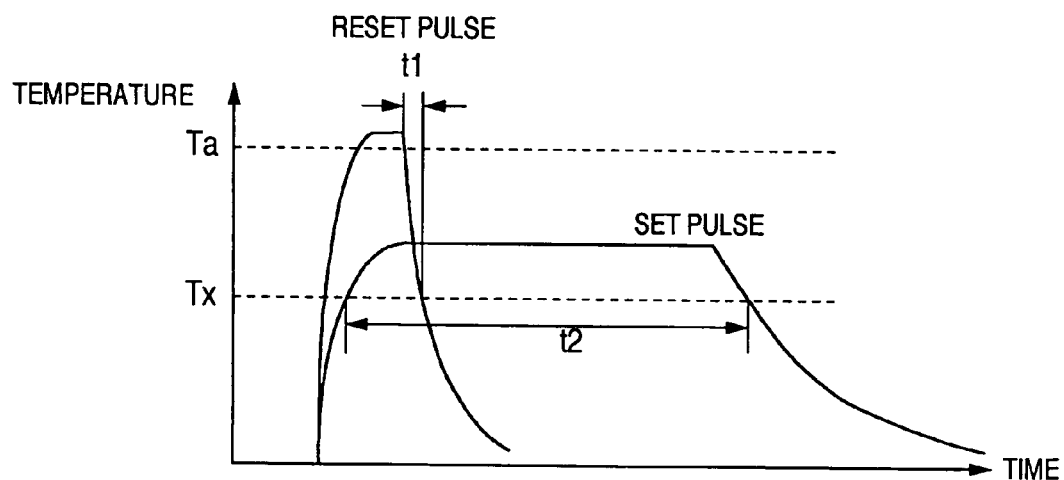
FIG. 3 is a diagram showing a relationship between a pulse width and a temperature necessary for a phase change of the memory element.
Figure 4:
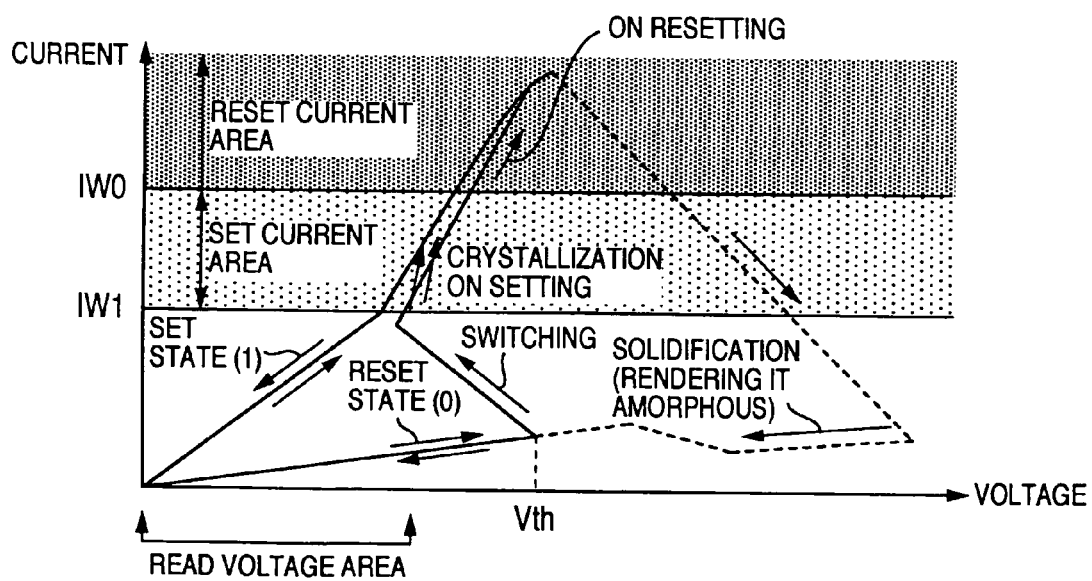
FIG. 4 is a diagram showing a current to voltage characteristic of the memory element.

The memory element uses the chalcogenide material such as a Zn—Ge—Te series including zinc (Zn), germanium (Ge) and tellurium (Te) as a material of a recording layer. This material is characterized in that, because its melting point and crystallization temperature are much higher than the materials such as a Ge—Sb—Te series experimented for the memory element in the past, it is usable at a high temperature, its electric resistance is high and, optically, its transmittance is high and variation in complex refractive index due to the phase change is not significant. The characteristics of a phase change memory using the chalcogenide material are, for example, described in IEEE International Electron Devices meeting, TECHNICAL DIGEST, pp. 803 to 806, 2001. Here, the chalcogenide means the material including at least one element of sulfur, selenium and tellurium. In the case of writing memory information 0' to this memory element, as shown in FIG. 3, a reset pulse is applied to heat the element to a temperature higher than a melting point Ta of the chalcogenide material and then quench it. The chalcogenide material is put in an amorphous state of high resistance if the reset pulse is shortened to reduce the entire given energy and a cool time t1 is set shorter to approximately 1 ns, for instance. Inversely, in the case of writing memory information 1', the chalcogenide material is put in a polycrystalline state of low resistance if a set pulse is applied to keep the memory element in a temperature area higher than a crystallization temperature Tx, which is lower than the melting point and equal to or higher than a glass transition point. While a time t2 required for crystallization is different according to a composition of the chalcogenide material, it is approximately 50 ns for instance. The temperature of the element shown in FIG. 3 depends on Joule heat generated by the memory element itself and thermal diffusion to its surroundings. Therefore, as indicated by characteristics I to V in FIG. 4, a current pulse of a value according to write information is applied to the memory element so as to control a crystalline state of the memory element. FIG. 4 schematically shows principles of operation of the memory element using the chalcogenide material. It shows that the memory information 1' is written in the case of applying a set current in a range of IW1 to IW0, and the memory information 0' is written in the case of applying a reset current over IW0. However, either state may be 0' or 1'. Hereafter, four writing operations will be described in detail according to FIG. 4.

First, in the case of writing 1' to the memory element in an initial state 1', if the set current is applied, it shuttles between the initial state and a set area by following a low resistance curve in a set (crystalline) state so that the state is kept. Secondly, in the case of writing 0' to the memory element in the initial state 1', if the reset current is applied, it reaches the reset current by following the low resistance curve in the set state. Next, melting partially starts due to the Joule heat so that conductivity gradually goes down. Furthermore, it is put in a high resistance state if the melting progresses. If the memory element in a liquid phase is quenched, the phase changes to the amorphous state, and so it returns to the initial state by following the high resistance curve in the reset (amorphous) state which is a little lower than the resistance in the liquid phase. The portion indicated by a dotted line in FIG. 4 represents a virtual line which shows a supposed change in the current due to the change in a resistance value in the case of applying the voltage as-is even though the reset pulse has already run out. Thirdly, in the case of writing 1' to the memory element in the initial state 0', if the set current is applied, it switches to a low resistance state when a terminal voltage of the memory element exceeds a threshold voltage Vth. The crystallization progresses due to the Joule heat being generated after the switching. If a current value reaches the set current, a crystallization area expands and the phase changes, and so the resistance value further decreases and it returns to the initial state by following the low resistance curve. Inclination of a volt-ampere curve becomes gentle at the middle because the area switched to the low resistance state is switched off so that only reduced resistance due to the crystallization remains. Fourthly, in the case of writing 0' to the memory element in the initial state 0', there is little time for the crystallization after the aforementioned switching, and so it reaches a reset area by following the low resistance curve due to the switching so as to perform the melting, quenching and solidification and return to the initial state.

In view of such principles of operation of the memory element, it needs to operate while controlling the voltage to be lower than the threshold voltage Vth at the maximum so as not to destroy the memory information on reading. In reality, the threshold voltage also depends on voltage application time, and tends to be reduced if the time is long. Therefore, it needs to be the voltage which does not exceed the threshold voltage and cause the switching to the low resistance state within reading time. Therefore, the operation for implementing the configuration of the memory array shown in FIG. 1 based on the principles will be described below.

(Reading Operation)

Figure 5:
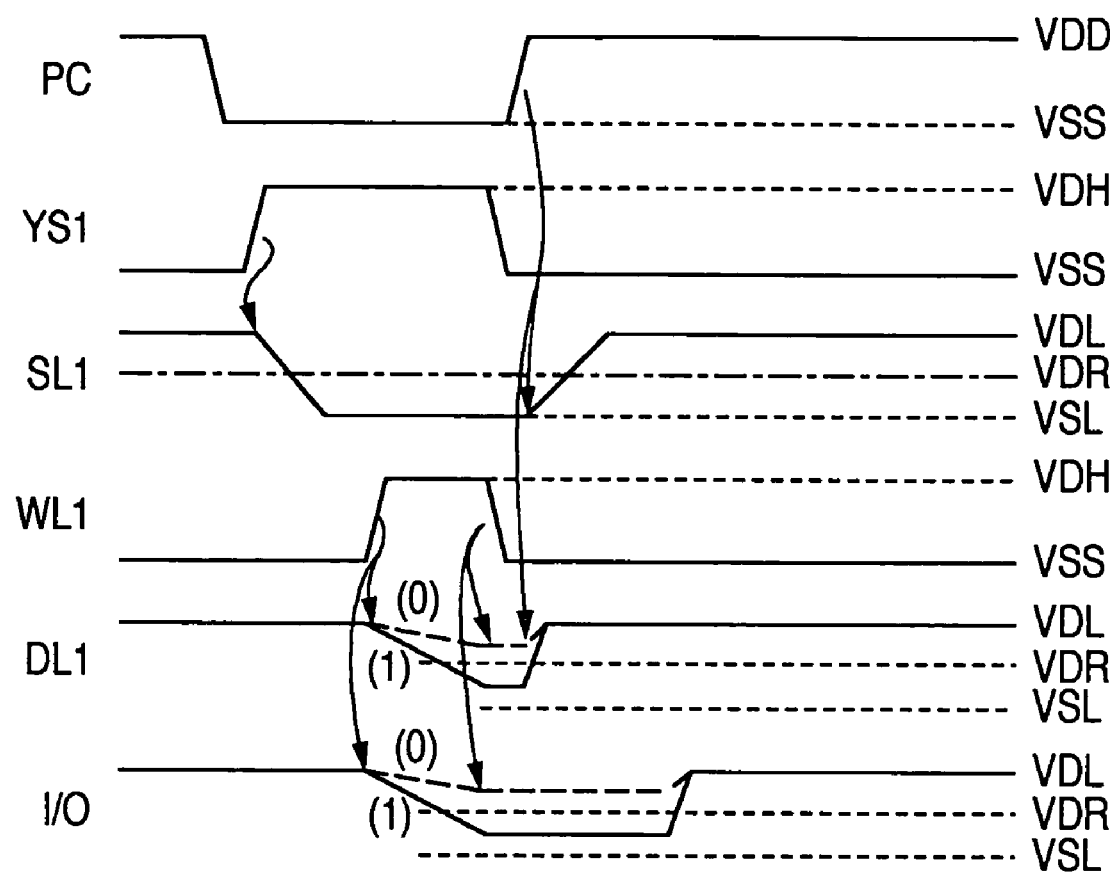
FIG. 5 is a diagram showing timing of a memory array reading operation according to the present invention.

Next, according to FIG. 5, a reading operation of a memory cell of the array configuration shown in FIG. 1 will be described. Here, FIG. 5 shows operation waveforms in the case of selecting a memory cell MC11.

First, the precharge enable signal PC is held at a line voltage VDD (1.5V for instance) in a standby state, and so the data lines DL and the source lines SL are kept at the precharge voltage VDL by the NMOS transistors QC and QD. Here, VDL is 1.0V, for instance, which is a value lower than VDD just by the threshold voltage of the transistors. The common data line I/O is also precharged at the precharge voltage VDL by the read circuit RC.

If the reading operation starts, the precharge enable signal PC which is at the line voltage VDD is driven to a ground potential VSS, and a column select line YS1 which is at ground potential VSS is driven by a pressure rising potential VDH (1.5V or more for instance) so that the transistors QA1 and QB1 conduct. At this time, the data line DL1 is kept at the precharge voltage VDL because it is equipotential to the common data line I/O while the source line SL1 is driven at a source voltage VSL (0.5V for instance) by the transistor QB1. As for the source voltage VSL and the precharge voltage VDL, the precharge voltage VDL is higher than the source voltage VSL, and the difference thereof is set to be in a relationship in which the terminal voltage of a resistance RM is within a range of a read voltage area shown in FIG. 4. Next, if a word line WL1, which has the ground potential VSS, is driven by the pressure rising potential VDH, the transistors QM in all the memory cells on the word line WL1 conduct. At this time, the current path is generated in the memory cell MC11 having generated a potential difference in the memory element RM, so that the data line DL1 and the common data line I/O are discharged toward the source voltage VSL at a speed according to the resistance value of the memory element RM. In the drawing, the resistance value is smaller and so discharge is faster in the case of holding the memory information 1' than the case of holding the memory information 0'. Therefore, a signal voltage according to the memory information is generated.

As for nonselective memory cells MC12 to MC1*m*, the potential difference in the memory element RM is 0 so that nonselective data lines DL12 to DL1*m* are kept at the precharge voltage VDL. To be more specific, only the memory cell MC11 selected by the word line WL1 and the source line SL1 applies a read current through the data line DL1. Here, it is possible, if after having read information discriminated by the read circuit RC, to let the word line WL1 fall. If the word line WL1 is continuously set up when this discrimination is late, there are the cases where, on reading the memory information 0', the selected data line DL1 is discharged to a vicinity of the source voltage VSL so that the difference between the signal voltage of reading 0' and the signal voltage of reading 1' decreases and the memory information can no longer be correctly read. In such a case, as in the drawing, it is possible to prevent a malfunction by letting the word line WL1 fall in timing before a data line voltage in the case of reading 0' exceeds a reference voltage VDR. It is possible, by letting the word line fall and blocking the current path, to keep the signal voltage on the common data line I/O so as to have the read circuit RC discriminate a generated positive or negative signal in reference to the reference voltage VDR. If the above reading operation is finished, the common data line I/O is driven by the precharge potential VDL so as to return to the standby state.

In the standby state, if the data lines and the source lines of the memory array are floated, a capacitance of the data line of which voltage is indefinite is charged from the common data line upon connecting the data lines to the common data line at a start of the operation. For this reason, in FIG. 5, the column select line YS1 is also allowed to fall according to the word line WL1, and furthermore, the precharge enable signal PC which is the ground potential VSS is driven to the line voltage VDD so as to drive the data lines and the source lines at the precharge voltage VDL and thereby put them in the standby state. The pressure rising potential VDH is the voltage widely used for DRAMs in the past, and is set up to satisfy the relationship of VDH>VDD+VTN by using the line voltage VDD and a threshold voltage VTN of the NMOS transistors. For instance, in the writing operation of the phase change memory, it is necessary to apply a larger current than that in the reading operation, as will be described later. For this reason, the present invention allows a correct writing operation to be performed by driving the word line WL and the column select line YS at the pressure rising potential VDH and thereby reducing the resistance of the NMOS transistors. It is also possible, by setting the precharge voltage VDL higher than the source voltage VSL, to have the source of the transistors QM in the select memory cells as the select source line so as to secure the voltage between the gate and the source of the transistors independently from the resistance of the memory element RM. Even in the case of an inverse potential relationship, the same selective operation is possible if the difference thereof is set within the range of the read voltage area shown in FIG. 3.

FIG. 5 is an example of driving the source line SL1 and then driving the word line WL1. It is also possible, depending on convenience of design, to drive the word line WL1 and then drive the source line SL1. In this case, the word line WL1 is driven first and the select transistors QM conduct, and so the terminal voltage of the memory element RM is secured at 0V. Thereafter, the terminal voltage of the memory element RM becomes higher than 0V if the source line SL1 is driven. However, that value is controllable by a driving speed of the source line SL1 so as to be within the range of the aforementioned read voltage area. Likewise, it is also possible to almost simultaneously drive the word line WL1 and the source line SL1. If the column select line YS1 is driven by preceding the pulse of a later drive timing of the word line WL1 and the source line SL1, it is possible to reduce a waiting time for an output to the I/O so as to accelerate access. In this case, as a matter of course, connections should be changed to independently drive the transistors QA1 and QB1 shown in FIG. 1.

The example of selecting the memory cell MC11 was shown above. The remaining memory cells on the same data line are not selected because a word line voltage thereof is fixed at the ground potential VSS, respectively. The remaining memory cells are also kept in a state of the nonselective memory cells because other data lines and source lines are at the same potential VDL.

In the above description, the word lines in the standby state are at the ground potential VSS, and the source lines in a selection state are at the positive source voltage VSL such as 0.5V. This voltage relationship is set up so that the current passing through the nonselective memory cells does not influence the operation. To be more specific, it should be set up so that, when the source line is selected and the word line has the nonselective memory cell such as the memory cell MC11 selected, the transistors QM of the nonselective memory cells such as MC21 to MCn1 are sufficiently off. As shown here, it is possible to reduce the threshold voltage of the transistors QM by rendering the word line voltage in the standby state as the ground potential VSS and rendering the source voltage VSL as the positive voltage. As the case may be, it is also possible to render the selected source line as the ground potential 0V and rendering the word line in the standby state as negative voltage. It is also possible to reduce the threshold voltage of the transistors QM in that case.

Although it is necessary to generate the negative voltage for the word line in the standby state, it is easy to stabilize the source line voltage on the selection because it is the ground potential VSS applied from the outside. If the threshold voltage of the transistors QM is sufficiently high, the source line on the selection and the word line in the standby state may be at the ground potential 0V. In that case, it is possible to further stabilize the source line voltage on the selection because it is the ground potential VSS applied from the outside and besides, the capacitance of the word line in the standby state works as a stabilization capacitance.

Furthermore, a description was given here as to the operation of discriminating the signal voltage read to the common data line I/O with the read circuit RC. However, the operation of discriminating the current passing on the common data line I/O is also possible. In that case, a sense circuit with a low input impedance, which is described in the aforementioned U.S. Pat. No. 5,883,827, is used for the read circuit RC. It is possible, by using a method of sensing the current, to reduce influence of a wiring capacitance of the common data line so as to reduce the reading time.

(Writing Operation)

Figure 6:
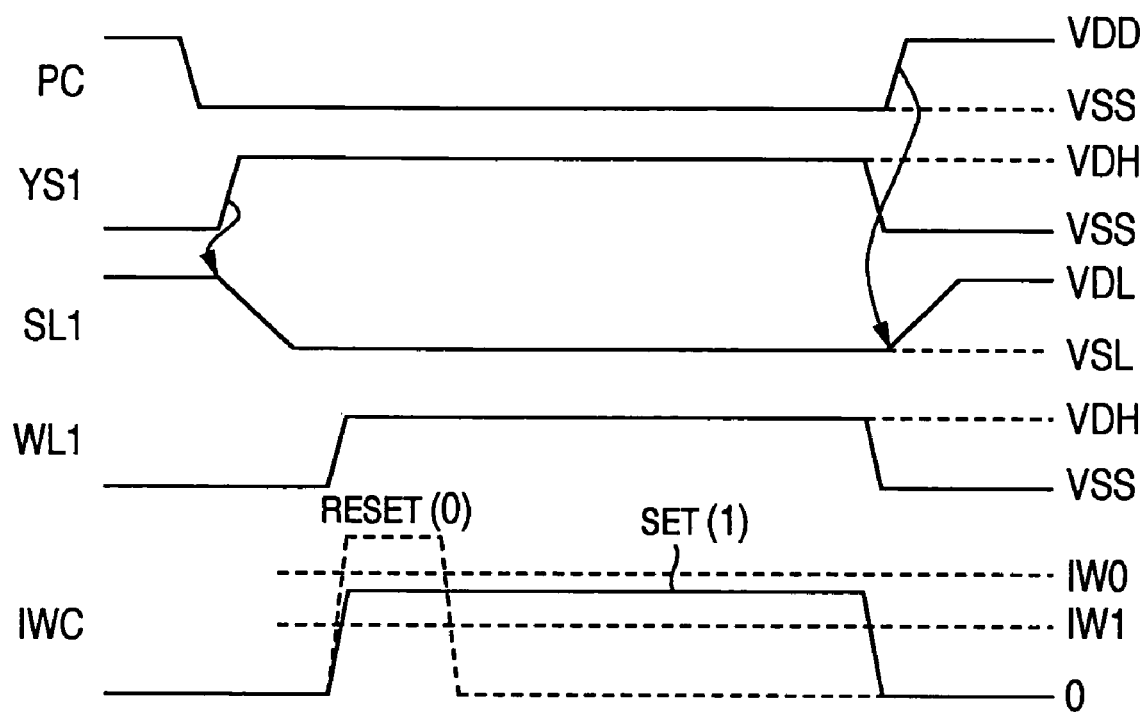
FIG. 6 is a diagram showing timing of a memory array writing operation according to the present invention.

Furthermore, according to FIG. 6, a memory cell writing operation by using the array configuration shown in FIG. 1 will be described. Here, FIG. 6 shows the operation waveforms in the case of selecting the memory cell MC11.

First, a selection operation of the memory cell MC11 is performed as with the reading operation. Once the memory cell MC11 is selected, the write circuit WC drives the common data line I/O so that a write current IWC is generated. In the case of writing 0', the reset current set at the value in the range shown in FIG. 4 is applied to the memory cell MC11. A pulse width of the reset current is short, and it returns to the standby state immediately after the driving so that the current value becomes 0. Such a reset current generates the Joule heat which is the same as the reset pulse shown in FIG. 3. Inversely, in the case of writing 1', the set current set at the value in the range shown in FIG. 4 is applied. The pulse width thereof is approximately 50 ns. Such a set current generates the Joule heat which is the same as the set pulse shown in FIG. 3. Thus, the application time and current value of a write pulse are controlled by the write circuit WC. Therefore, the memory cells are in the selection state just by the pulse width of the set current whichever memory information is written.

(Memory Cell Configuration)

Next, an example of the memory array configuration will be described. This configuration is characterized by placing active regions of the MOS transistors aslant to the word lines, data lines and source lines. It implements a memory cell configuration in which the source lines are wired with a first metal layer, the data lines are wired with a second metal layer, and the source lines are provided correspondingly to the data lines.

Figure 7:
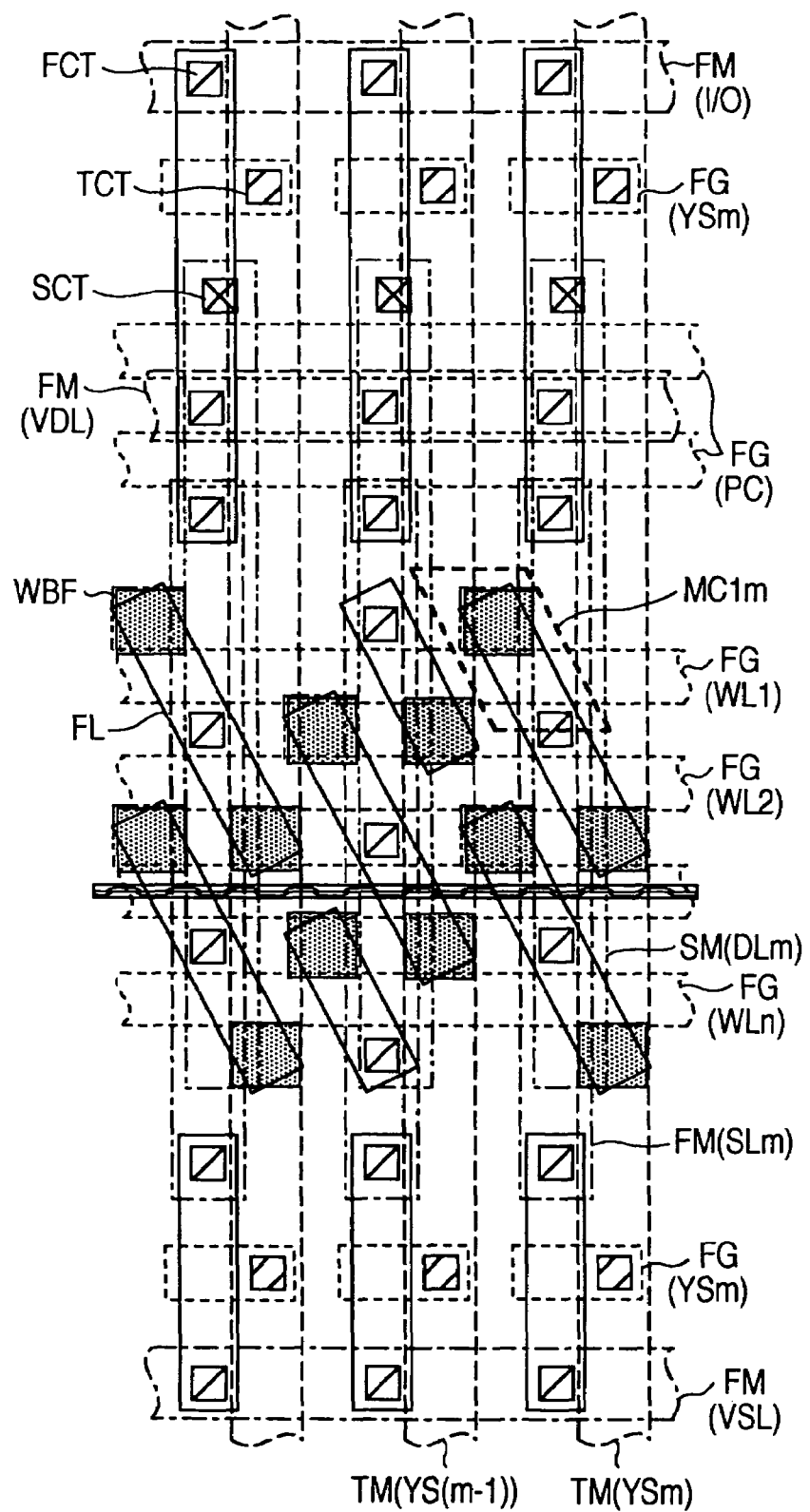
FIG. 7 is a diagram showing a layout of the memory array according to the present invention.

FIG. 7 shows a layout. In FIG. 7, reference character FL denotes an active region pattern, FM denotes a first metal layer pattern such as a source line SL and a power feeder, SM denotes a second metal layer pattern for the data line DL, TM denotes a third metal layer pattern for the column select line YS, FG denotes a first gate electrode pattern of the transistors formed on a silicon substrate, FCT denotes a first metal layer contact pattern, SCT denotes a second metal layer contact pattern, TCT denotes a third metal layer contact pattern, and WBF denotes an upper electrode layer of the memory element. Well-known optical lithography can be used for patterning all of these patterns. In FIG. 7, the memory elements are formed under the upper electrode layers WBF. A corresponding node name is indicated in a parenthesis after a pattern name. Therefore, it is easy to understand that the memory cell MC1m is placed at a position indicated at the intersection of the word line WL1, data line DLm and source line SLm for instance.

Figure 8:
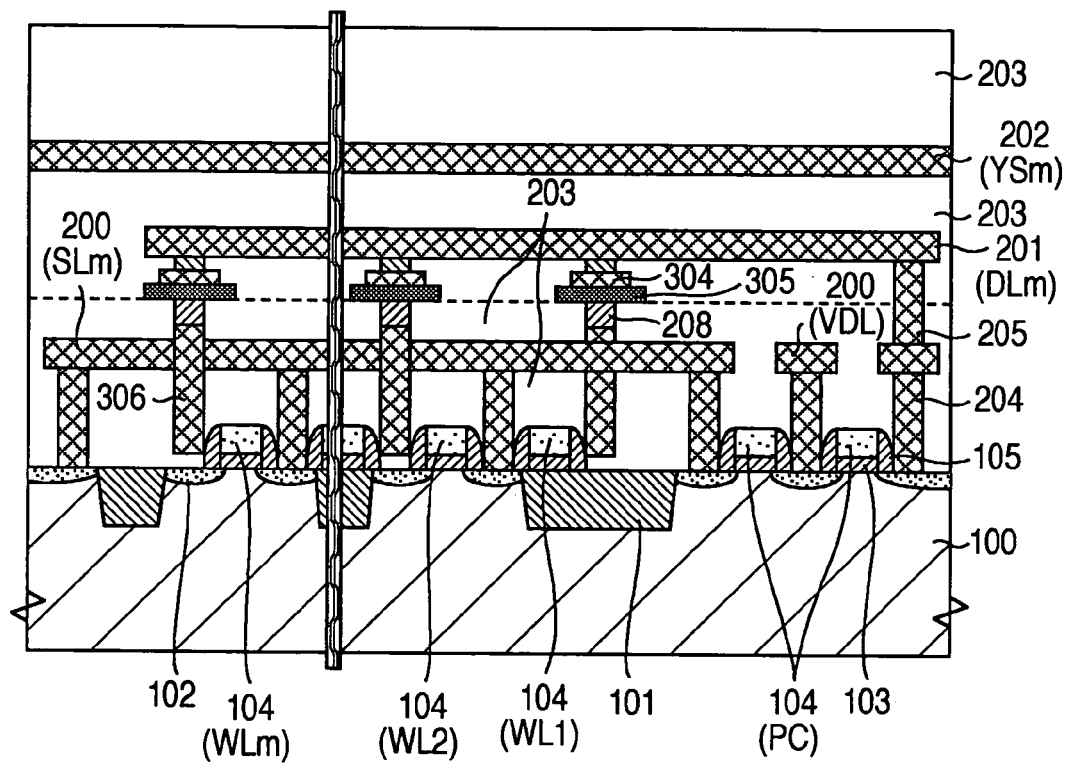
FIG. 8 is a sectional view schematically showing the configuration of the memory array shown in the layout in FIG. 7.

FIG. 8 is a diagram schematically showing a section of the memory array viewed vertically to the data line. Reference numeral 100 denotes a P-type semiconductor substrate, 101 denotes an insulator for isolating the elements embedded in the P-type semiconductor substrate, 102 denotes an N-type diffusion zone area in the active region pattern FL in FIG. 7, 103 denotes a gate oxide film of the transistor formed on the substrate, 104 denotes a gate electrode of the transistor formed on the substrate, 105 denotes a side wall formed with an insulating film on the transistor formed on the substrate. Reference numeral 200 denotes a first metal layer used for the source line SL and power feeder and so on. Reference numeral 201 denotes a second metal layer used for the data line DL and so on, 202 denotes a third metal layer used for the column select line YS, 203 denotes an interlayer insulating film, 204 denotes a contact for connecting the N-type diffusion zone area 102 with the first metal layer 200, and 205 denotes the contact for connecting the first metal layer 200 with the second metal layer 201. Furthermore, reference numeral 208 denotes a Ti—Al—N layer which is a lower heating member of the memory element RM, 304 denotes a $W_{80}Ti_{20}$ upper electrode, 305 denotes a chalcogenide material film to be the memory element RM, and 306 denotes the contact for connecting the lower heating member 208 with the N-type diffusion zone area 102. The upper electrode has a smaller area than the chalcogenide material film so that the reset current will not be large by excessively losing heat from the chalcogenide material film. Here, FIG. 8 indicates the node name in the parenthesis after a layer name on the assumption of viewing the data line DLm and source line SLm from an array edge. For instance, it is possible, by the node name of the gate electrode indicated by 104 in FIG. 8, to easily grasp placement of the select transistor and precharge transistor QCm and QDm.

The metal layers and contacts are formed with tungsten of a high melting point or its alloy such as $W_{80}Ti_{20}$, for instance, in order to prevent deterioration of electrical characteristics due to heat treatment on forming upper layers and a chemical reaction and mutual diffusion between the chalcogenide material and the electrodes on rewriting many times. The contacts are formed as if to bury a clearance of a side wall 107. This processing technology is a so-called self-aligning process widely used for a DRAM in the past.

The memory element according to this embodiment has a high resistance value because the contact area of the chalcogenide material 305 and the lower heating member 208 is reduced by using the insulating film 203 as shown in FIG. 8. For this reason, it can generate high Joule heat with a small current so as to implement the phase change memory capable of a low-power writing operation. It is also possible, according to the layout shown in FIG. 7, to place the word lines with a minimum pitch of 2F (F is a minimum processing dimension) and the data lines with a pitch of 3F which is 1.5 times that of the word lines so as to implement the phase change memory cell of six times a square of F.

The following summarizes the effects of the above-mentioned configurations and operations of the memory array and memory cells therein. First, the memory array according to this embodiment has the source line SL parallel with the data line DL and has the source of the select transistor QM in the memory cell connected to the corresponding source line SL as shown in FIG. 1, and so it is possible to reduce power consumption in the reading operation. To be more precise, the transistors QA and QB are placed on the data line DL and source line SL, respectively, and the precharge transistors QC and QD are further placed on the data line DL and source line SL side of the precharge circuit, respectively. It is possible, in such a configuration, to drive the source line corresponding to the selected data line to the source voltage VSL. For this reason, it is possible to form the current path only in the cell at the intersection of the select word line and select source line so as to generate the read signal only on the selected data line. Therefore, it is feasible, by controlling charge and discharge of the nonselective data lines, to reduce the power consumption in the reading operation of the phase change memory and a MRAM for instance. In the case of applying the present invention to the phase change memory, the selection operation, as in the case of the reading operation, is performed in the writing operation so that the low-power phase change memory can be implemented as a whole.

The memory array according to this embodiment has the potential of the nonselective data lines kept by the selection operation mentioned as to the first effect. Therefore, it has little noise due to capacitance coupling between the data lines, and is capable of generating a stable read signal. Thus, it is possible to implement the phase change memory of a stable reading operation.

(Memory Cell Configuration Using Vertical Transistors)

Next, another example of the memory array configuration will be described. This configuration is characterized by using vertical MOS transistor as the select transistor QM in a sub-array shown in FIG. 1.

Figure 9:
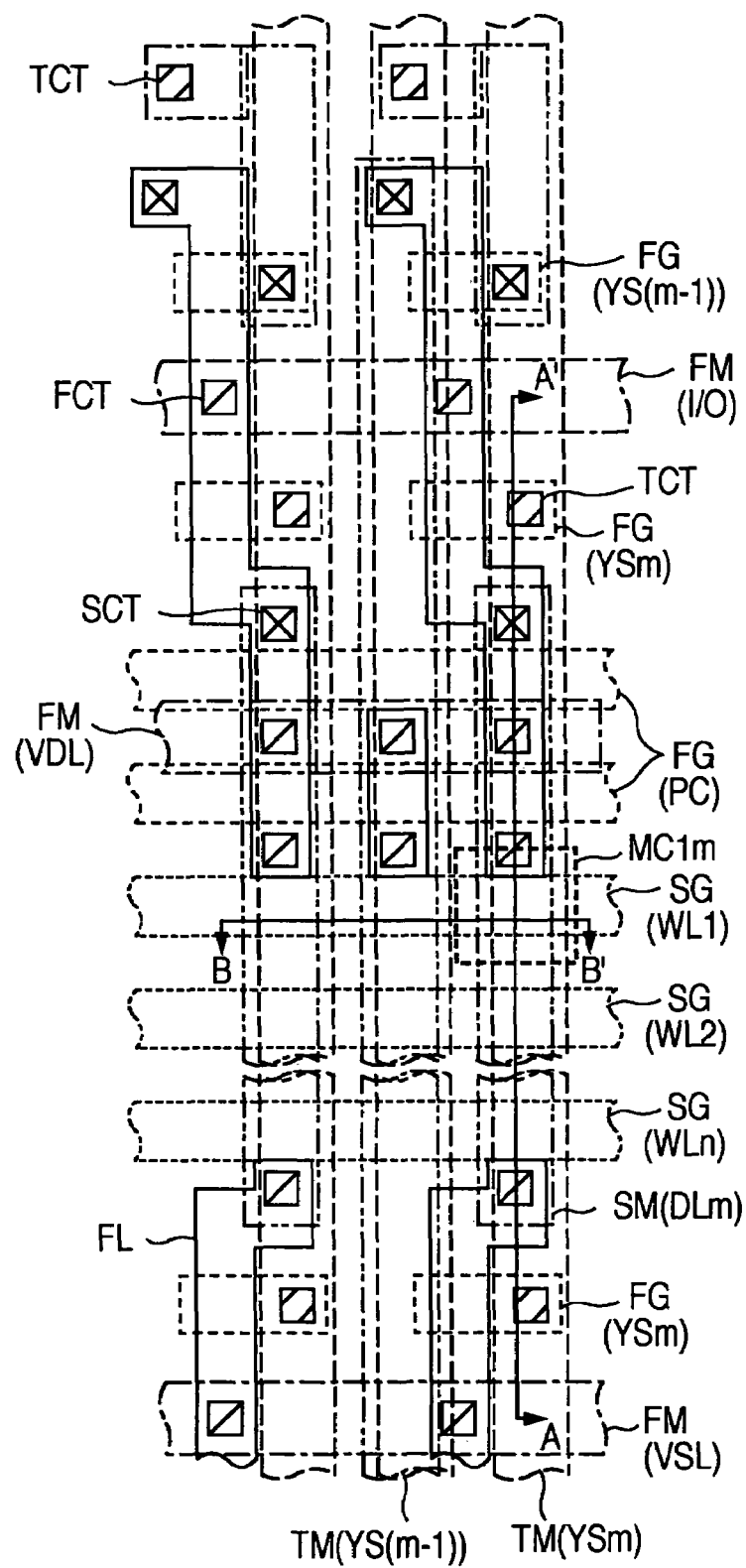
FIG. 9 is a diagram showing another layout of the memory array according to the present invention.

FIG. 9 shows the layout. As in FIG. 7, reference character FL denotes the active region pattern, FM denotes the first metal layer pattern such as the source line SL, SM denotes the second metal layer pattern for the data line DL, TM denotes the third metal layer pattern for the column select line YS, FG denotes the first gate electrode pattern of the transistors formed on the silicon substrate, SG denotes a second gate electrode pattern of the word line WL, that is, the vertical transistor, FCT denotes the first metal layer contact pattern, SCT denotes the second metal layer contact pattern, and TCT denotes the third metal layer contact pattern. Here, the memory cell is created by laminating the vertical transistors and chalcogenide in the area in which the second gate electrode pattern SG and the second metal layer pattern SM are intersecting. The well-known optical lithography can be used for the patterning of these patterns. In FIG. 9, the corresponding node name is indicated in the parenthesis after the pattern name on the assumption that a line A to A' is indicated on the data line DLm and a line B to B' is indicated on the word line WL1. For instance, it is easy to understand that the memory cell MC1m is placed at the position indicated at the intersection of the word line WL1 and the data line DLm.

Figure 10:
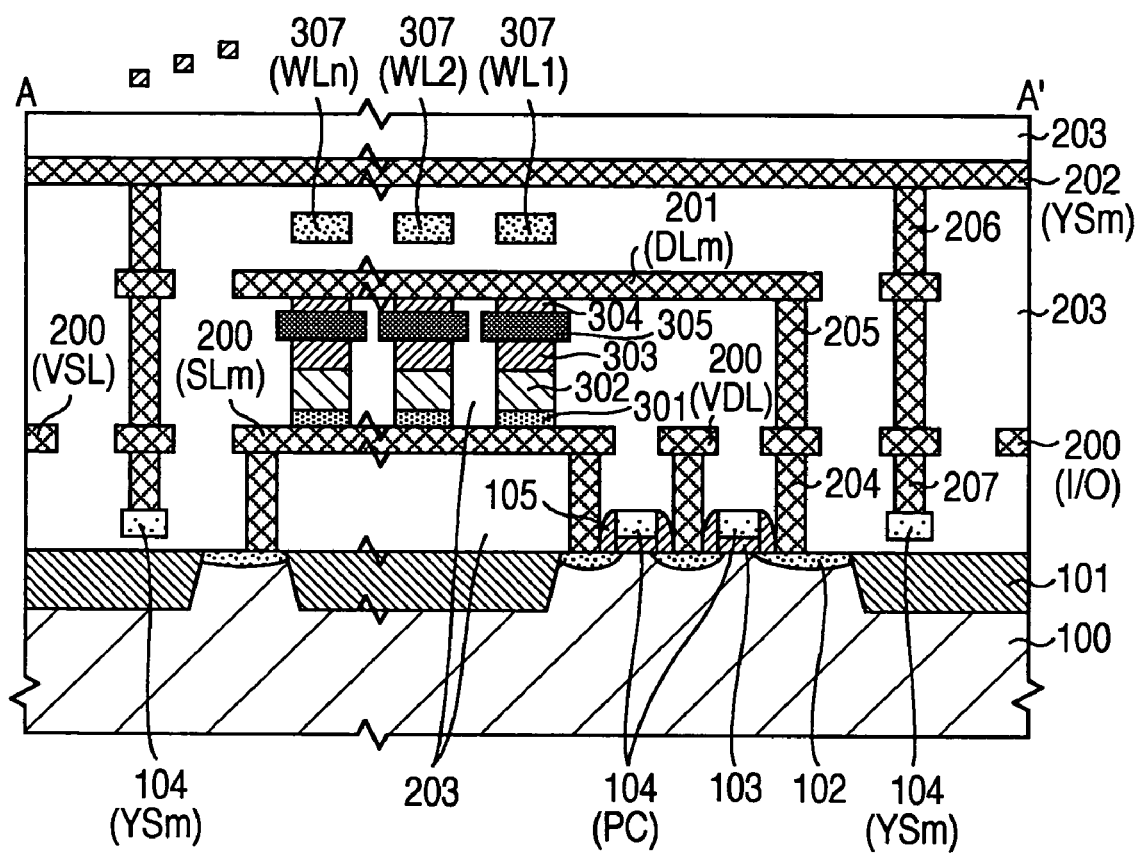
FIG. 10 is a sectional view showing the configuration of the portion along a line A to A' shown in the layout in FIG. 9.
Figure 11:
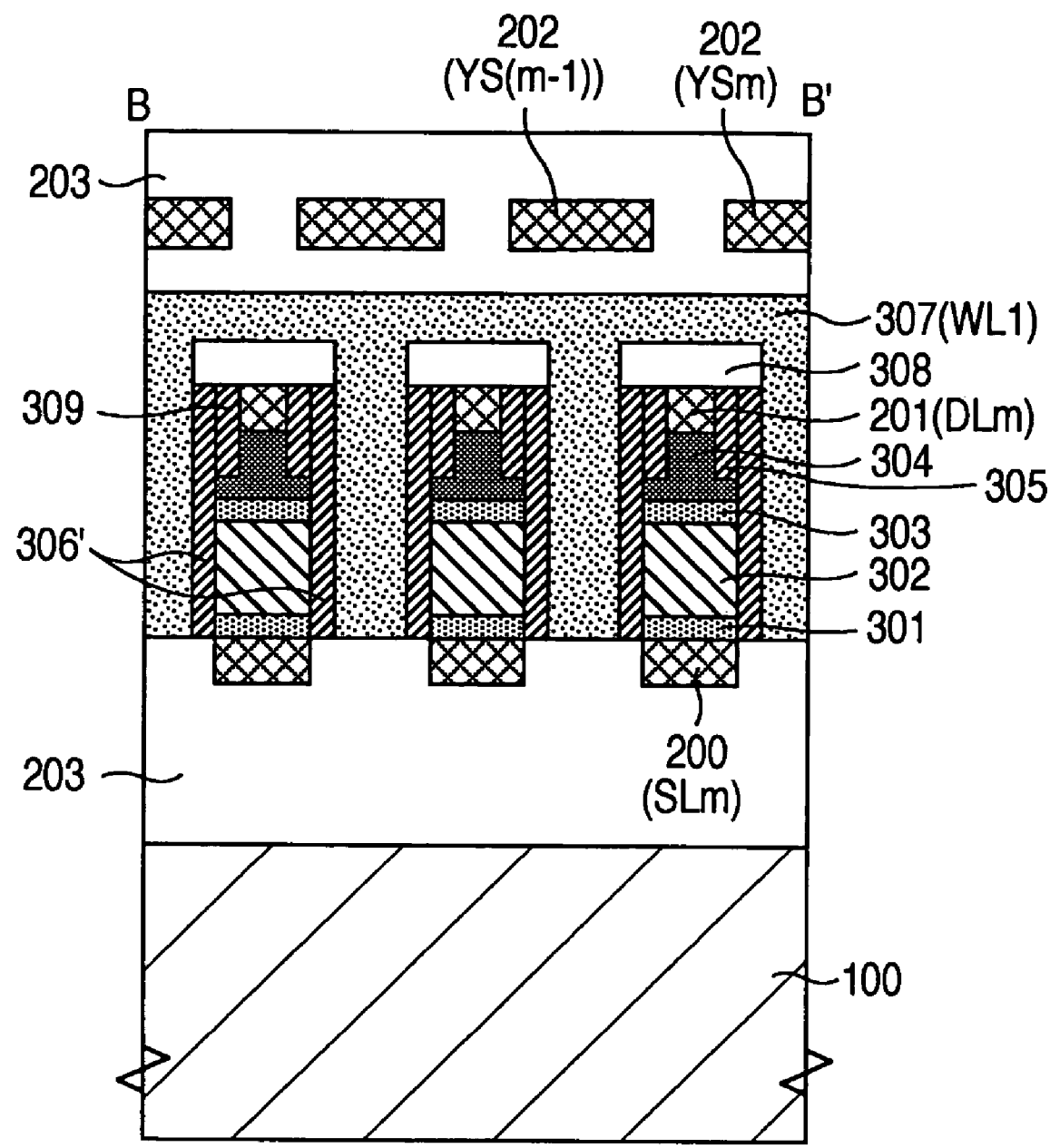
FIG. 11 is a sectional view showing the configuration of the portion along a line B to B' shown in the layout in FIG. 9.

FIG. 10 shows the section (hereafter, referred to as the section A to A') of the portion along the line A to A' shown in FIG. 9. Likewise, FIG. 11 shows the section (hereafter, referred to as the section B to B') of the portion along the line B to B' shown in FIG. 9. In FIGS. 10 and 11, reference numeral 100 denotes the P-type semiconductor substrate, 101 denotes the insulator for separating the elements embedded in the P-type semiconductor substrate, 102 denotes the N-type diffusion zone area in the active region pattern FL in FIG. 9, 103 denotes the gate oxide film of the transistor formed on the substrate, 104 denotes the gate electrode of the transistor formed on the substrate, 105 denotes the side wall formed with an insulating film on the transistor formed on the substrate. Reference numeral 200 denotes the first metal layer used for the source line SL, power feeder, common data line I/O and so on, 201 denotes the second metal layer used for the data line DL and so on, 202 denotes the third metal layer used for the column select line YS, 203 denotes the interlayer insulating film, 204 denotes the contact for connecting the N-type diffusion zone area 102 with the first metal layer, and 205 denotes the contact for connecting the first metal layer with the second metal layer, 206 denotes the contact for connecting the second metal layer with the third metal layer, 207 denotes the contact for connecting the first metal layer with the gate electrode 104 of the transistor formed on the substrate, and 208 denotes a resistant heating layer comprised of ZnTe. It may also be the material wherein a 5 group element is added to ZnTe from another element 3 of less than 10 atom percent. Furthermore, reference numeral 301 denotes the N-type polysilicon to be a source electrode of a vertical transistor PM, 302 denotes an intrinsic polysilicon with no added impurity to be a channel of the vertical transistor PM, 303 denotes the N-type polysilicon to be a drain electrode of the vertical transistor PM, 305 denotes the chalcogenide material to be the memory element RM, 304 denotes the upper electrode, 306 denotes the gate oxide film formed on the side wall of the vertical transistor, 307 denotes the gate electrode, that is, the word line WL of the vertical transistor, 308 denotes the interlayer insulating film formed between the data line DL and the word line WL, and 309 denotes a side wall oxide film.

If a thin layer of a dielectric such as an oxide, a nitride, a sulfide or a carbide or a mixed film of the dielectrics and the chalcogenide material is formed between the chalcogenide material for the memory and one of the electrodes or a resistant heating member, the dielectric in that area has a filament-like area of the chalcogenide formed therein on an initial setting to the low resistance state, which becomes a thin conductive path. It is possible, as the current passes only on that path and the phase changes, to obtain a high resistance value and a low operating current value. A desirable dielectric material is the one having a main constituent (constituting 60 percent or more) of a germanium oxide, a germanium nitride, a silicon oxide, a silicon nitride, an aluminum nitride, a titanium nitride, an aluminum oxide, a titanium oxide, a chromium oxide, a tantalum oxide, a molybdenum oxide, a silicon carbide or a zinc sulfide, or a mixed material thereof. These materials also have an effect to increase adhesive force between the chalcogenide material layer and the electrodes or insulator. It is desirable that this dielectric material film is in contact with one of the electrodes, and it is most desirable to have it provided in contact with a negative electrode in terms of stability of a memory operation considering that the filament is formed by a positive ion. However, it can also operate in a state in which it is not contacting either electrode. In the case of a mixed layer of the dielectric material and chalcogenide, there was no high resistance effect unless the content of the chalcogenide is less than 60 mole percent.

According to this embodiment, a 5 nm-thick film which is a mixture of 70 percent of $Ta_2O_5$ and 30 percent of a recording layer material is provided. Film thickness is in the range of 2 nm to 25 nm, and a resistance ratio is kept at one digit or higher so as to ensure a rise in the resistance of twice or more. If the film thickness is small, there is no problem because a dielectric layer originally has a pinhole in which the chalcogenide material enters. In the case of the film thickness of 15 nm or more, however, it is necessary to initially apply the voltage higher by 1.5 times or more with a stably operational voltage and cause a dielectric breakdown so as to form the filament. Such a method of providing the layer having the filament-like area constantly formed and the effects thereof are in common even in the case of using the recording layer outside the range of the composition of the recording layer material of the present invention such as a $Ge_2Sb_2Te_5$ recording layer. However, there are further effects of the higher resistance and lower currents when combined with the recording layer of the present invention of which resistance value is higher than that of the $Ge_2Sb_2Te_5$ recording layer. The reset (amorphous) current became 80 microamperes.

Here, as with FIG. 9, FIGS. 10 and 11 indicate the node name in the parenthesis after the layer name on the assumption that the line A to A' is indicated on the data line DLm and the line B to B' is indicated on the word line WL1. For instance, it is possible, by the node name of the gate electrode indicated by 104 in FIG. 10, to easily grasp the placement of the gate electrodes of the transistors QAm, QBm, QCm and QDm.

Thus, it is possible, by using the vertical transistors, to make a so-called cross-point cell formed at each intersection of the word line and the data line. To be more specific, if the word line and the data line are processed in the minimum processing dimension F, the area of the memory cell becomes four times the square of F. Therefore, it is possible to implement a highly integrated and high-capacity phase change memory.

In an off state, the vertical transistor used here has the intrinsic polysilicon 302 which is a channel area completely depleted, and operates as a so-called complete depletion SOI (Silicon On Insulator) transistor. For this reason, adjustment of the threshold voltage is difficult compared to the MOS transistor on the substrate. As described in conjunction with the reading operation shown in FIG. 5, a voltage setting in which the potential of the word lines in the standby state is lower than that of the source lines in the selection state is suitable because the threshold voltage of the vertical transistor can be low.

The above mainly described the phase change memory having the memory cell comprised of one memory element using the chalcogenide material and one transistor. However, the configuration of the memory cell is not limited to it.

The element according to this embodiment is capable of rewriting a million times or more, and can be manufactured at a high yield ratio.

As for the characteristics of the element according to this embodiment, dependency thereof on the chalcogenide recording layer material is as follows. A desirable content range of Zn is 20 atom percent to 50 atom percent. If it is less than that, an upper limit temperature capable of a continuous operation becomes lower than 140° C. so that its practical use in an application requiring a high-temperature operation is difficult. If it is more than that, oxidation resistance is reduced so that the recording layer is damaged or exfoliated in a memory element production process and it is not possible to pass it to a final process. An especially desirable range is 25 atom percent to 35 atom percent. If it is within this range and if the content of Ge or Sb is in the range of 25 atom percent to 35 atom percent, there is no problem as to the process and the operation at 140° C. or higher is possible. The element characteristics are good even if it includes at least one element selected from a 2b group, a 1b group, 3a to 7a groups and an 8 group other than Zn. To obtain a high crystallization temperature, however, Zn is most desirable, and Cd is the next. The desirable content range of Ge or Sb is less than 40 atom percent. If it exceeds 40 atom percent, the melting point lowers and a volume change due to the phase change exceeds an acceptable value, and exfoliation occurs at less than 100,000 times of rewriting. A more desirable range is 25 atom percent to 35 atom percent. In the case of Ge, if less than that, particles fall off a target on sputtering and the yield ratio became less than 50 percent. If more than that, both the melting point and crystallization temperature are lowered and the upper limit temperature capable of the continuous operation becomes lower than 130° C. so that it is difficult in terms of practicality. In the case of Sb, 25 percent or more is desirable because, if less than that, the oxidation resistance is insufficient and the yield ratio of the process becomes less than 50 percent. However, it is not as effective at preventing target particles from falling, and so there is no problem if capable of sputtering by a sputter-up method while there is a problem in the case of a sputter-down method. If the content of Te is less than 40 atom percent, it is very difficult to render it amorphous that it stops changing state in less than 10 times of rewriting. Other than those described above, it may include In, Si, Sn, Bi, Pb, Se, N, O, H and transition metal elements for example Au, Ag and Ti by less than 10 atom percent. As for In, Sn, Bi and Pb, there is the effect of improving a crystallization speed by 30 percent or more by adding 3 atom percent or more. Si and Se have the effect of preventing oxidation during the production process.

Both of the above Ge and Sb may be included. In that case, it is desirable that a sum of the content of either element is in a desirable content range as if included alone respectively. It is possible to provide features of both if the ratio between Ge and Sb is in the range of 1:2 to 2:1.

As for a heating member in the upper portion of the lower contact (plug), the Joule heat thereof can, additionally, heat the lower portion of the recording layer in the case of, instead of TiAlN, using the same material of which melting point is 1,000° C. or higher and content of Zn or Cd is more than the recording layer material by 10 atom percent or more, so that it is possible to reduce the reset current by approximately 30 percent compared to the case of a double contact and obtain a good multiple rewriting characteristic.

There is an advantage of increasing the number of times capable of rewriting by accumulating a barrier film of the nitride and oxide of the transition metal such as TiAlN, a film of the same material of which melting point is 1,000° C. or higher and content of Zn or Cd is more than the recording layer material by 10 atom percent or more, a metal conductive film such as $W_{80}Ti_{20}$ or a film stack thereof. It is also possible, as a matter of course, to put a conductive film of a low thermal conductivity such as ITO (mixture of indium and the oxide of tin) in between for the purpose of curbing thermal diffusion required to change a phase state of the chalcogenide.

According to the above embodiment, it is possible, as the resistance value is high, to combine it with a high-resistance transistor and reduce the reset current. As its photo transmittance is high, a multilayer memory by exposure to light and voltage application is possible. It is also possible, in terms of the process, to control concavity and convexity on a surface of a sputtering target and improve a production yield. It is also effective at improving the number of times capable of rewriting and reducing the reset current if a similar material is used for the plug in the lower portion of the recording layer.

Second Embodiment

According to this embodiment, an address of the memory element is specified not only electrically but also by using the light. The elements are laminated in four layers vertically to a substrate surface so as to increase the number of elements per area. In this case, the recording layer including the 2 group elements such as Zn and Cd is advantageous because of a broad optical band gap. For instance, a $Zn_{25}Ge_{25}Te_{50}$ recording layer is used.

Figure 12:
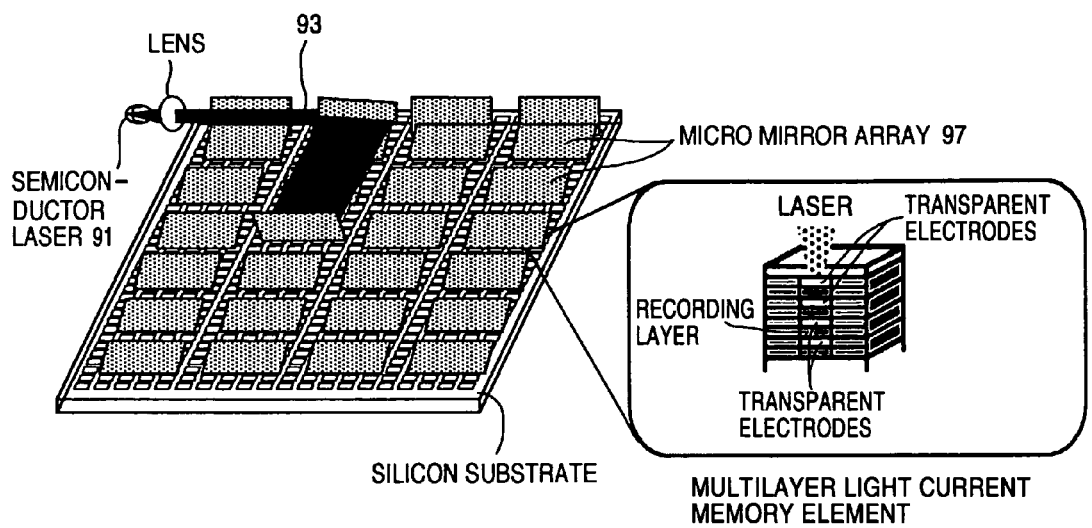
FIG. 12 is a diagram showing the configuration of a multilayer memory element array used in combination with a mirror array.
Figure 13:
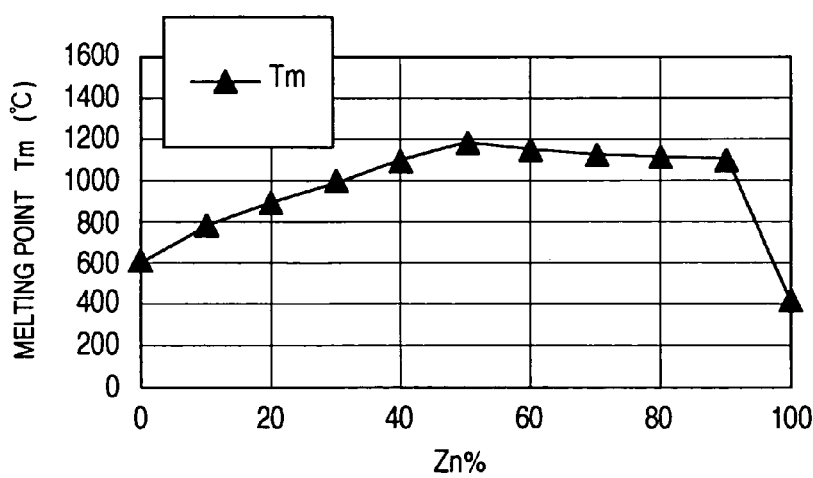
FIG. 13 is a diagram showing a change in a melting point of a solid-phase portion when adding Zn to $Ge_{25}Te_{75}$.
Figure 14:
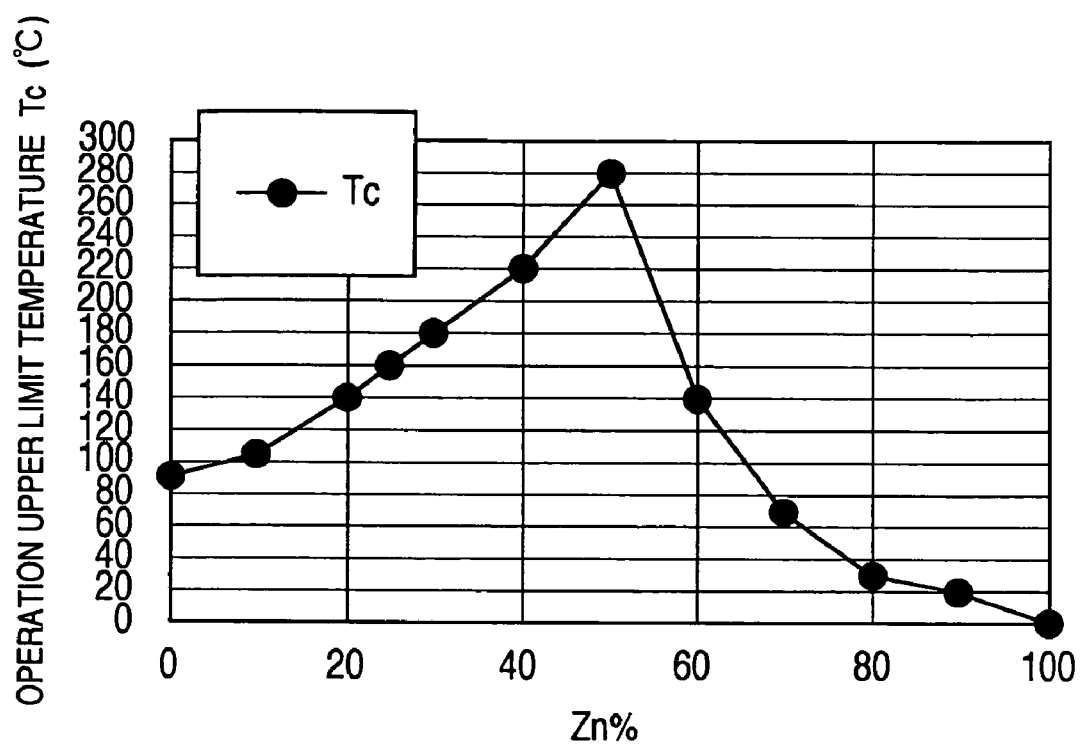
FIG. 14 is a diagram showing a change in a maximum operating temperature of the memory element when adding Zn to $Ge_{25}Te_{75}$.

As shown in FIG. 12, a light 93 of a semiconductor laser 91 of 660 nm wavelength is led by a guide mirror to a mirror reflector array 97 of 500×500 pieces of 16 μm square formed by silicon single crystals which is one of MEMS technologies. Each individual mirror of the mirror reflector array is in charge of a memory element group of four layers of 20×20 pieces in a plane, and is capable of turning around one axis by +15 degrees. Each mirror has a cylindrical lens formed on a memory element group side, and forms an elongate light spot of 0.5 μm width and 16 μm length. One line of the element group of 32 lines which the vertical mirror in the drawing is in charge of is lighted by a change in a mirror angle. Each element has four layers as in a partially enlarged view. Each layer is constituted to sandwich the chalcogenide recording layer with ITO transparent electrodes, where a $SiO_2$ heat insulating layer of 50 nm is formed between the layers. The transparent electrode on one side of the element in each layer is divided into 16 vertically long rectangular pieces per mirror, and horizontal address specification in the drawing is performed by selecting the electrode. Vertical layer selection is performed by selecting a pair of transparent electrodes and applying the voltage thereto. It is thereby possible to implement a simple device configuration and price reduction even if rendered four-layer. If alignment of a mirror array and the memory array is thereby performed precisely, there is also a merit in removing the memory array from the device to replace it. Each mirror is driven by an electrostatic force or an electromagnetic force by means of a transistor array in the lower portion thereof. The technique of the multilayer light current memory element is disclosed in U.S. Ser. No. 10/336,717 of joint inventor, the content of which is incorporated by reference herein.

A photo carrier is generated in the memory element by laser irradiation, which is accelerated in an electric field to intensify the carrier so that the reading by recording and resistance can be performed only by the element to which both the light and voltage are provided. The reading is performed by an optical power of approximately ⅕ times the recording.

According to this embodiment, it is essential that the photo transmittance of the memory element in each layer is 30 percent or more. It is designed to be 50 percent or more in reality.

According to this embodiment, the range of the desirable composition of the recording layer is the same as in the first embodiment. In the case of this embodiment, it is important that the photo transmittance of the recording layer is high. While the composition of $Zn_{50}Te_{50}$ is desirable on that point, a desirable composition range and a preferable composition range are the same as those in the first embodiment because there are the conditions on the process and phase change described in the first embodiment.

In the case of using an array laser as a laser light source for instance, it is possible to speed up a data transfer rate to close to four times by simultaneously sending a laser to a plurality of mirrors.

The number of the mirror reflector arrays can be increased to 1500×1500 or so in the case of the use requiring a high capacity.

It is possible, according to the embodiment, to obtain a large memory capacity with a simple device configuration.

According to the present invention, it is possible to obtain high heat resistance in the memory using a phase change material. As the memory element using the material hereof is capable of the high-temperature operation, it is sufficiently usable for the application in which an ambient temperature is apt to rise such as an in-vehicle use.

It should be further understood by those skilled in the art that although the foregoing description has been made on embodiments of the invention, the invention is not limited thereto and various changes and modifications may be made without departing from the spirit of the invention and the scope of the appended claims.

What is claimed is:

1. A memory device comprising:
    a recording film including at least one element selected from the group consisting of Ge and Sb, Te of 40 atom percent or more, and at least one element selected from Zn and Cd of 25 atom percent to 35 atom percent, said recording film being adapted to record information by causing a reversible phase change between a crystal phase and an amorphous phase; and
    an electrode adapted to apply a voltage to said recording film, wherein a content of Sb is 25 atom percent to 35 atom percent.

2. The memory device according to claim 1, wherein said device is adapted to be operable in an atmosphere at 140° C. or more.

3. The memory device according to claim 1, having a region in which Zn or Cd content is relatively more than that of said recording film by more than 10 atom percent, said region being located between said recording film and an electrode.

4. A memory device comprising:
    a recording film including at least one element selected from the group consisting of Ge and Sb, Te of 40 atom percent or more, and at least one element selected from Zn and Cd of 25 atom percent to 35 atom percent, said recording film being adapted to record information by causing a reversible phase change between a crystal phase and an amorphous phase;
    an electrode adapted to apply a voltage to said recording film, and
    a region in which Zn or Cd content is relatively more than that of said recording film by more than 10 atom percent, said region being located between said recording film and an electrode.

5. A memory device comprising:
    a plurality of memory cells;
    a plurality of word lines adapted to select said plurality of memory cells; and
    a plurality of data lines placed to be orthogonal to said plurality of word lines and having signals read thereto from said plurality of memory cells, and
    wherein each of said plurality of memory cells comprises a recording film of Ge and Sb, Te of 40 atom percent or more, and at least one element selected from Zn and Cd of 25 atom percent to 35 atom percent, said recording film being adapted to record information by causing a reversible phase change between a crystal phase and an amorphous phase, and an electrode adapted to apply a voltage to said recording film,
    wherein a content of Sb is 25 atom percent to 35 atom percent.

6. The memory device according to claim 5, wherein an insulating film is provided between said recording film and said electrode.

7. The memory device according to claim 1, wherein both of the Ge and Sb are included and the ratio between Ge and Sb is in the range of 1:2 to 2:1.

8. The memory device according to claim 4, wherein said region has a multilayer structure with electrodes for voltage application and is adapted to transmit 30 percent or more of a recording light or reproduction light which is applied to it.

* * * * *